United States Patent
Seki et al.

(10) Patent No.: US 8,497,185 B2
(45) Date of Patent: Jul. 30, 2013

(54) METHOD OF MANUFACTURING SEMICONDUCTOR WAFER, AND COMPOSITE BASE AND COMPOSITE SUBSTRATE FOR USE IN THAT METHOD

(75) Inventors: Yuki Seki, Itami (JP); Issei Satoh, Itami (JP); Koji Uematsu, Itami (JP); Yoshiyuki Yamamoto, Itami (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 0 days.

(21) Appl. No.: 13/107,286

(22) Filed: May 13, 2011

(65) Prior Publication Data

US 2012/0228613 A1  Sep. 13, 2012

(30) Foreign Application Priority Data

Mar. 7, 2011  (JP) ................................. 2011-049247

(51) Int. Cl.
*H01L 29/02*  (2006.01)
*H01L 21/762*  (2006.01)
*H01L 29/22*  (2006.01)

(52) U.S. Cl.
USPC  438/455; 257/52; 257/E21.567; 257/E29.003; 257/E29.094

(58) Field of Classification Search
USPC ............ 257/618, 52, 506, 614, 629, E21.567, 257/E29.003, E29.094, E27.112, E29.002; 438/455
See application file for complete search history.

(56) References Cited

U.S. PATENT DOCUMENTS

| 5,357,399 A | * | 10/1994 | Salisbury | 361/529 |
| 2009/0098739 A1 | * | 4/2009 | Ohnuma et al. | 438/781 |
| 2009/0224370 A1 | * | 9/2009 | Slutz | 257/618 |

FOREIGN PATENT DOCUMENTS

JP  2003-165798  6/2003

* cited by examiner

*Primary Examiner* — Calvin Lee
*Assistant Examiner* — Monica D Harrison
(74) *Attorney, Agent, or Firm* — Drinker Biddle & Reath LLP (57) ABSTRACT

A method of manufacturing a semiconductor wafer of the present invention includes the steps of: obtaining a composite base by forming a base surface flattening layer having a surface RMS roughness of not more than 1.0 nm on a base; obtaining a composite substrate by attaching a semiconductor crystal layer to a side of the composite base where the base surface flattening layer is located; growing at least one semiconductor layer on the semiconductor crystal layer of the composite substrate; and obtaining the semiconductor wafer including the semiconductor crystal layer and the semiconductor layer by removing the base surface flattening layer by wet etching and thereby separating the semiconductor crystal layer from the base. Thus, a method of manufacturing a semiconductor wafer capable of efficiently manufacturing the semiconductor wafer regardless of the type of a base, and a composite base and a composite substrate suitably used in that manufacturing method are provided to efficiently manufacture a semiconductor device.

12 Claims, 3 Drawing Sheets

METHOD OF MANUFACTURING SEMICONDUCTOR WAFER, AND COMPOSITE BASE AND COMPOSITE SUBSTRATE FOR USE IN THAT METHOD

BACKGROUND OF THE INVENTION

1. Field of the Invention

The present invention relates to a method of manufacturing a semiconductor wafer, and a composite base and a composite substrate for use in that method.

2. Description of the Background Art

Manufacturing a wafer including a semiconductor crystal layer and a semiconductor layer by forming a composite substrate in which the semiconductor crystal layer is attached to a different composition base having a chemical composition different from that of the semiconductor crystal layer, growing the semiconductor layer on the semiconductor crystal layer of the composite substrate, and thereafter removing the different composition base has been proposed to efficiently manufacture a semiconductor device.

For example, Japanese Patent Laying-Open No. 2003-165798 discloses manufacturing a wafer including a single crystal sapphire substrate and a gallium nitride single crystal by attaching the single crystal sapphire substrate to a base to form a sapphire composite substrate, epitaxially growing the gallium nitride single crystal on a sapphire surface of the sapphire composite substrate, and thereafter removing the base by wet etching.

SUMMARY OF THE INVENTION

Since the base is removed by wet etching in a method disclosed in Japanese Patent Laying-Open No. 2003-165798, there are problems that the method requires a long period of time to remove the base, causing a reduction in efficiency, and that the method cannot be applied to a base for which it is difficult to perform wet etching.

To solve the aforementioned problems and efficiently manufacture a semiconductor device, one object of the present invention is to provide a method of manufacturing a semiconductor wafer capable of efficiently manufacturing the semiconductor wafer regardless of the type of a base, and a composite base and a composite substrate suitably used in that manufacturing method.

According to an aspect, the present invention is directed to a method of manufacturing a semiconductor wafer, including the steps of: obtaining a composite base by forming a base surface flattening layer having a surface RMS (root mean square) roughness of not more than 1.0 nm on a base; obtaining a composite substrate by attaching a semiconductor crystal layer to a side of the composite base where the base surface flattening layer is located; growing at least one semiconductor layer on the semiconductor crystal layer of the composite substrate; and obtaining the semiconductor wafer including the semiconductor crystal layer and the semiconductor layer by removing the base surface flattening layer by wet etching and thereby separating the semiconductor crystal layer from the base.

In the method of manufacturing a semiconductor wafer in accordance with the present invention, the base surface flattening layer can have a thickness of not less than 0.1 µm and not more than 50 µm. Further, the base surface flattening layer can include at least one selected from the group consisting of silicon oxide, silicon nitride, metal oxide, and a metal. Further, a difference between a thermal expansion coefficient of the base and a thermal expansion coefficient of the semiconductor crystal layer can be set to not more than $4.5 \times 10^{-6} K^{-1}$. Further, the base can include at least one selected from the group consisting of a sintered body and a metal. Further, the semiconductor crystal layer can include at least one selected from the group consisting of a group III-V compound semiconductor crystal, a group II-VI compound semiconductor crystal, and an oxide semiconductor crystal.

In addition, in the step of obtaining the composite substrate by attaching the semiconductor crystal layer to the side of the composite base where the base surface flattening layer is located in the method of manufacturing a semiconductor wafer in accordance with the present invention, the base surface flattening layer and the semiconductor crystal layer can be attached with a bonding layer interposed therebetween. Further, the base surface flattening layer and the semiconductor crystal layer can be attached further with a crystal surface flattening layer, which is formed between the semiconductor crystal layer and the bonding layer to be in contact with the semiconductor crystal layer, interposed therebetween. Here, the crystal surface flattening layer can include at least one selected from the group consisting of silicon oxide, silicon nitride, silicon oxynitride, metal oxide, metal nitride, metal oxynitride, and a metal.

According to another aspect, the present invention is directed to a composite base including a base, and a base surface flattening layer disposed on the base, wherein the base surface flattening layer has a surface RMS roughness of not more than 1.0 nm, and a thickness of not less than 0.1 µm and not more than 50 µm. In the composite base in accordance with the present invention, the base surface flattening layer can include at least one selected from the group consisting of silicon oxide, silicon nitride, metal oxide, and a metal. Further, the base can include at least one selected from the group consisting of a sintered body and a metal.

According to still another aspect, the present invention is directed to a composite substrate including the composite base described above, and a semiconductor crystal layer disposed on a side of the composite base where the base surface flattening layer is located, wherein a difference between a thermal expansion coefficient of the base and a thermal expansion coefficient of the semiconductor crystal layer is not more than $4.5 \times 10^{-6} K^{-1}$.

In the composite substrate in accordance with the present invention, the base surface flattening layer can include at least one selected from the group consisting of silicon oxide, silicon nitride, metal oxide, and a metal. Further, the base can include at least one selected from the group consisting of a sintered body and a metal. Further, the semiconductor crystal layer can include at least one selected from the group consisting of a group III-V compound semiconductor crystal, a group II-VI compound semiconductor crystal, and an oxide semiconductor crystal.

Furthermore, the composite substrate in accordance with the present invention can further include a bonding layer disposed between the base surface flattening layer and the semiconductor crystal layer. In addition, the composite substrate in accordance with the present invention can further include a crystal surface flattening layer disposed between the semiconductor crystal layer and the bonding layer to be in contact with the semiconductor crystal layer. Here, the crystal surface flattening layer can include at least one selected from the group consisting of silicon oxide, silicon nitride, silicon oxynitride, metal oxide, metal nitride, metal oxynitride, and a metal.

According to the present invention, a method of manufacturing a semiconductor wafer capable of efficiently manufacturing the semiconductor wafer regardless of the type of a base, and a composite base and a composite substrate suitably used in that manufacturing method can be provided to efficiently manufacture a semiconductor device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[Embodiment 1]

Figure 1:
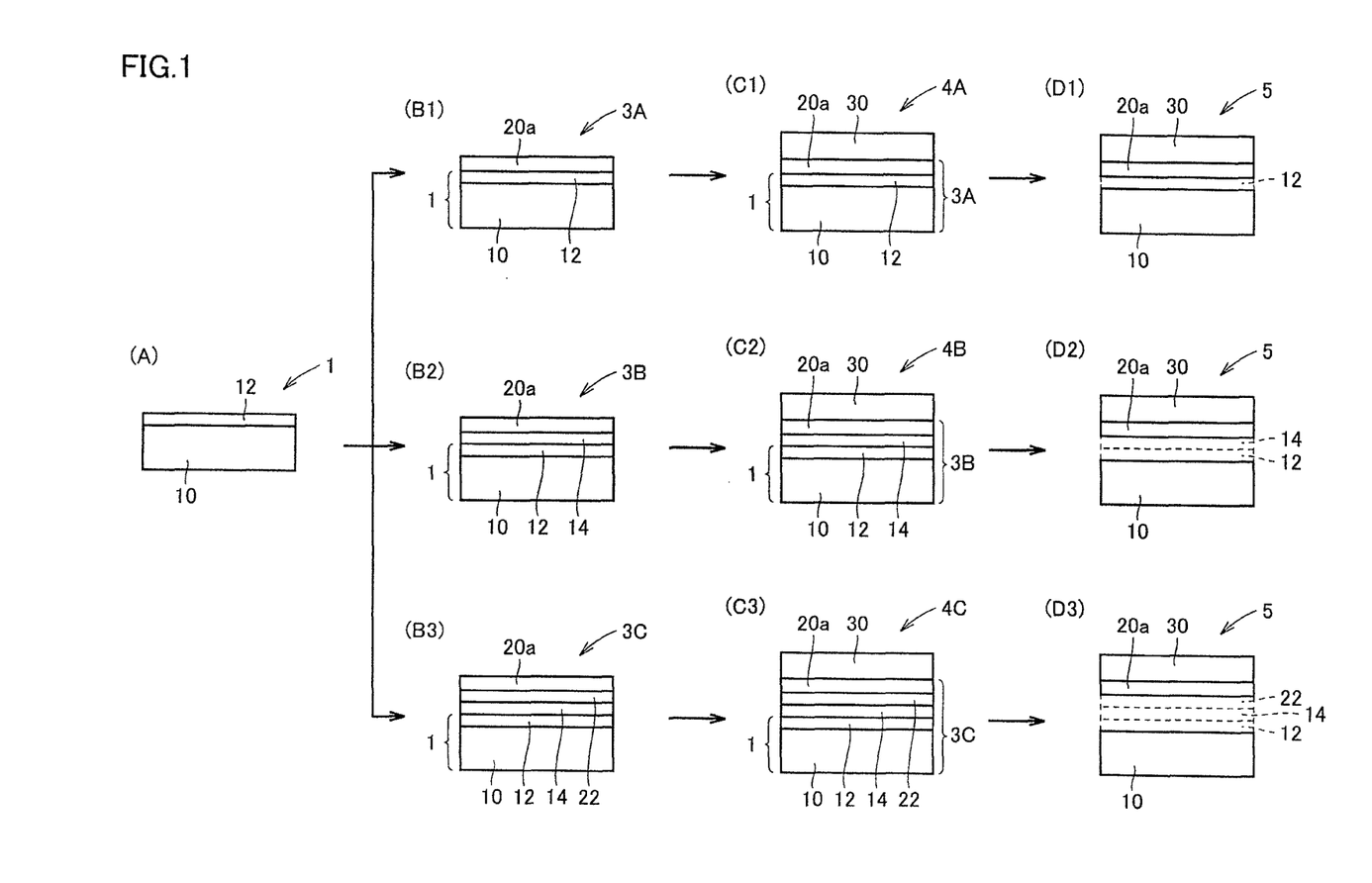
FIG. 1 is a schematic cross sectional view showing examples of a method of manufacturing a semiconductor wafer in accordance with the present invention.

Referring to FIG. 1, a method of manufacturing a semiconductor wafer as one embodiment of the present invention includes the step of obtaining a composite base 1 by forming a base surface flattening layer 12 having a surface RMS roughness of not more than 1.0 nm on a base 10 (FIG. 1(A)), the step of obtaining a composite substrate 3A, 3B, 3C by attaching a semiconductor crystal layer 20a to a side of composite base 1 where base surface flattening layer 12 is located (FIG. 1(B1), (B2), and (B3)), the step of growing at least one semiconductor layer 30 on semiconductor crystal layer 20a of composite substrate 3A, 3B, 3C (FIG. 1(C1), (C2), and (C3)), and the step of obtaining a semiconductor wafer 5 including semiconductor crystal layer 20a and semiconductor layer 30 by removing base surface flattening layer 12 by wet etching and thereby separating semiconductor crystal layer 20a from base 10 (FIG. 1(D1), (D2), and (D3)). With the method of manufacturing a semiconductor wafer in the present embodiment, semiconductor wafer 5 can be efficiently manufactured regardless of the type of base 10.

{Step of Obtaining Composite Base}

Referring to FIG. 1(A), the step of obtaining composite base 1 includes a sub-step of preparing base 10 and a sub-step of forming base surface flattening layer 12 on base 10. The step can further include a sub-step of polishing a surface of base surface flattening layer 12.

(Sub-Step of Preparing Base)

In the step of preparing base 10, although base 10 to be prepared is not particularly limited, it preferably includes at least one selected from the group consisting of a sintered body and a metal, from the viewpoint that its thermal expansion coefficient can be easily adjusted. Although the sintered body is not particularly limited, it preferably includes at least one selected from the group consisting of silicon oxide and metal oxide. Suitable examples of the silicon oxide include $SiO_2$ and the like, suitable examples of the metal oxide include MgO, $Al_2O_3$, $TiO_2$, and the like, and suitable examples of a composite oxide made of the silicon oxide and the metal oxide include $MgO$—$SiO_2$, $Al_2O_3$—$SiO_2$, $TiO_2$—$SiO_2$, and the like. In the sintered body, its thermal expansion coefficient can be easily adjusted by changing the chemical composition of the sintered body. The metal is not particularly limited, and includes a single metal and an alloy. Suitable examples of the single metal include Mo, Ta, Ni, Pt, and the like, and suitable examples of the alloy include Mo—Cu, Cu—W, Ni—Cr—Fe, and the like.

(Sub-Step of Forming Base Surface Flattening Layer)

In the sub-step of forming base surface flattening layer 12, although a method of forming base surface flattening layer 12 is not particularly limited, a gas phase method such as a CVD (chemical vapor deposition) method, a sputtering method, and a deposition method, a liquid phase method such as a spin coating method and a thermal spraying method, or the like is preferable, from the viewpoint of forming the base surface flattening layer having a small surface RMS roughness. In particular, the spin coating method, the CVD method, the deposition method, or the like is preferable, from the viewpoint of forming the base surface flattening layer having an extremely small surface RMS (root mean square) roughness of about 1.0 nm or smaller.

Base surface flattening layer 12 is required to have a surface RMS roughness of not more than 1.0 nm, preferably not more than 0.7 nm, and more preferably not more than 0.5 nm, from the viewpoint that a semiconductor crystal layer can be attached thereon, or from the viewpoint that a bonding layer having even and flat surfaces can be formed thereon and further a semiconductor crystal layer can be attached to the bonding layer, in a later step. Here, the surface RMS (root mean square) roughness is obtained by sampling a portion of a roughness curved plane by a reference area in the direction of its average plane, and calculating the root square of the average value of squares of deviations from the average plane to a measurement curved plane in the sampling portion, and is equivalent to Rq defined in JIS B0601-2001. The surface RMS roughness can be measured with an AFM (atomic force microscope).

Further, although the thickness of base surface flattening layer 12 is not particularly limited, it is preferably not less than 0.1 μm, and more preferably not less than 0.5 μm, from the viewpoint of facilitating wet etching of base surface flattening layer 12 in a later step, and from the viewpoint of setting the surface RMS roughness of base surface flattening layer 12 disposed on base 10 to as small as not more than 1.0 nm when base 10 is a sintered body. In addition, the thickness of base surface flattening layer 12 is preferably not more than 50 μm, and more preferably not more than 20 μm, from the viewpoint of reducing the cost for forming base surface flattening layer 12.

Although base surface flattening layer 12 is not particularly limited, it preferably includes at least one selected from the group consisting of silicon oxide, silicon nitride, metal oxide, and a metal, from the viewpoint of facilitating wet etching of base surface flattening layer 12 in a later step, and from the viewpoint of high surface flatness and high bondability to the semiconductor crystal layer and the bonding layer. Suitable examples of the silicon oxide include $SiO_2$ and the like, suitable examples of the silicon nitride include $Si_3N_4$ and the like, suitable examples of the metal oxide include MgO, $Al_2O_3$, $TiO_2$, $Y_2O_3$, and the like, and suitable examples of a composite oxide made of the silicon oxide and the metal oxide include $MgO$—$SiO_2$, $Al_2O_3$—$SiO_2$, $TiO_2$—$SiO_2$, and the like. Further, the metal is not particularly limited, and includes a single metal and an alloy. Suitable examples of the single metal include Mo, Pt, Ni, Al, W, Ta, and the like, and suitable examples of the alloy include Mo—Cu, Cu—W, Ni—Cr—Fe, and the like.

(Sub-Step of Polishing Surface of Base Surface Flattening Layer)

The sub-step of polishing a surface of base surface flattening layer 12 can ensure that base surface flattening layer 12 formed on base 10 has a surface RMS roughness of not more than 1.0 nm. A method of polishing the surface of base surface flattening layer 12 is not particularly limited as long as it can set the surface RMS roughness to not more than 1.0 nm. Suitable examples of the method include mechanical polishing, chemical mechanical polishing (CMP), chemical polishing, and the like.

{Step of Obtaining Composite Substrate}

Referring to FIG. 1(B1), (B2), and (B3), the step of obtaining composite substrate 3A, 3B, 3C is performed by attaching semiconductor crystal layer 20a on the side of composite base 1 where base surface flattening layer 12 is located. With such a step, composite substrate 3A, 3B, 3C having semiconductor crystal layer 20a with high crystallinity can be efficiently obtained. Composite substrate 3A, composite substrate 3B, and composite substrate 3C have respectively different bonding forms between composite base 1 and semiconductor crystal layer 20a, and they are manufactured through respectively different sub-steps described below.

(Step of Obtaining Composite Substrate 3A)

Figure 2:
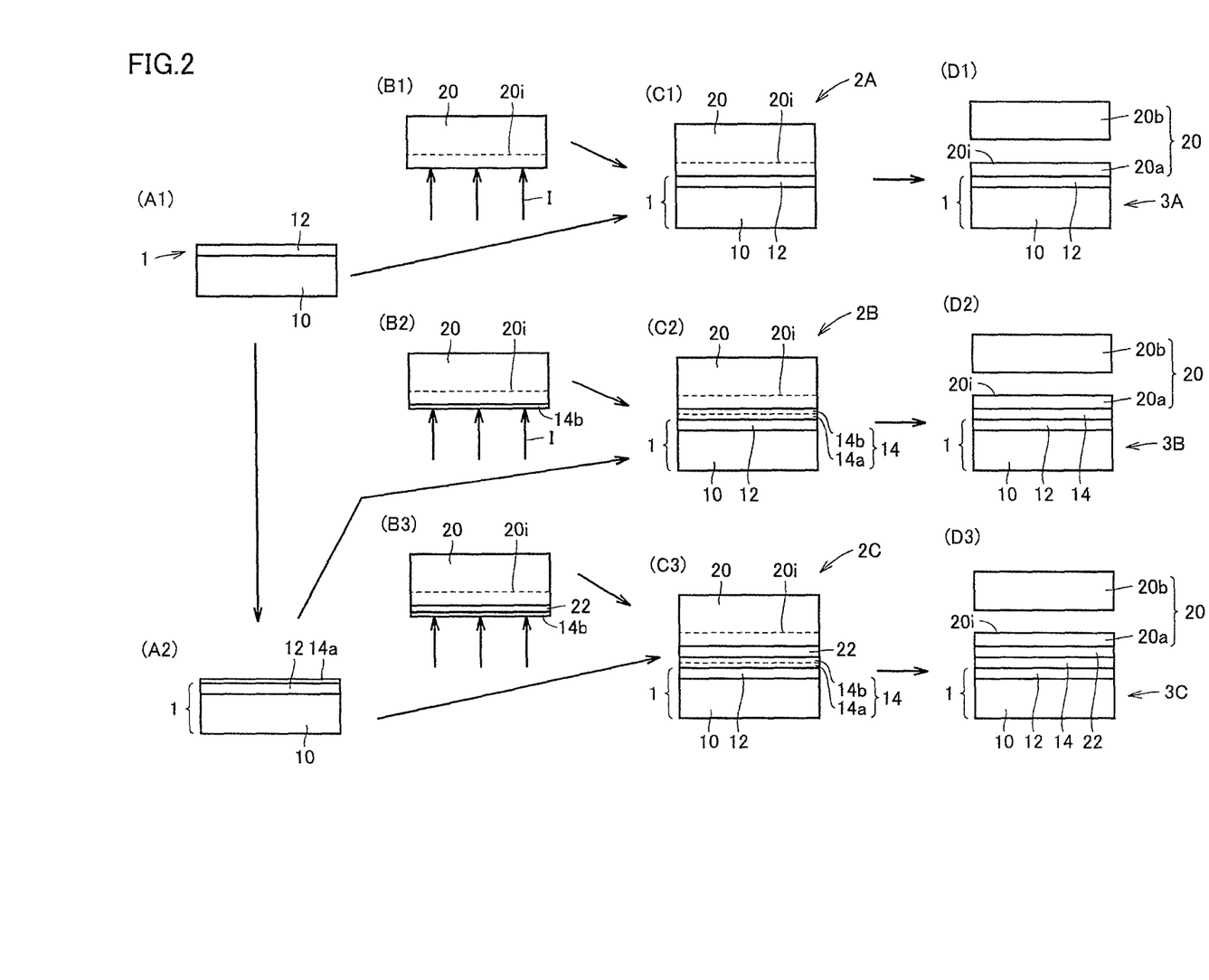
FIG. 2 is a schematic cross sectional view showing examples of a step of obtaining a composite substrate in accordance with the present invention.
Figure 4:
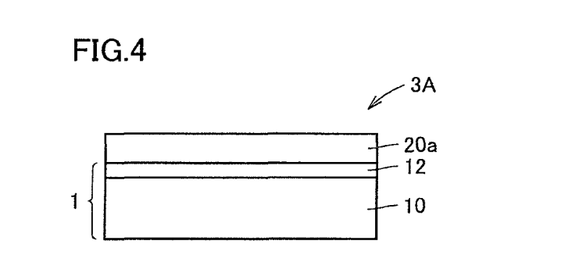
FIG. 4 is a schematic cross sectional view showing an example of the composite substrate in accordance with the present invention.

Referring to FIGS. 2 and 4, composite substrate 3A includes composite base 1, and semiconductor crystal layer 20a disposed on base surface flattening layer 12 of composite base 1. For example, composite substrate 3A has a form in which base surface flattening layer 12 of composite base 1 and semiconductor crystal layer 20a are directly bonded to each other.

Referring to FIG. 2(A1), (B1), (C1), and (D1), the step of obtaining composite substrate 3A is performed by directly attaching semiconductor crystal layer 20a to base surface flattening layer 12 of composite base 1.

Specifically, the step of obtaining composite substrate 3A includes a sub-step of preparing composite base 1 (FIG. 2(A1)), a sub-step of preparing a semiconductor crystal body 20 in which an ion implanted region 20i is formed at a predetermined depth from a surface (FIG. 2(B1)), a sub-step of attaching a surface of base surface flattening layer 12 of composite base 1 and the surface of semiconductor crystal body 20 on a side where ion implanted region 20i is located (FIG. 2(C1)), and a sub-step of separating semiconductor crystal body 20 at ion implanted region 20i (FIG. 2(D1)).

Referring to FIG. 2(A1), the sub-step of preparing composite base 1 is identical to the step of obtaining composite base 1 described above, and thus will not be repeated here.

Referring to FIG. 2(B1), the sub-step of preparing semiconductor crystal body 20 in which ion implanted region 20i is formed is performed by implanting ions I from the surface of semiconductor crystal body 20 to a region at the predetermined depth. Although ions I to be implanted are not particularly limited, ions having a small mass number, for example, hydrogen ions, helium ions, or the like are preferable, from the viewpoint of reducing a decrease in the crystallinity of semiconductor crystal body 20 due to ion implantation. Ion implanted region 20i in semiconductor crystal body 20 is more brittle than the remaining region due to ion implantation.

Referring to FIG. 2(C1), an attachment method in the sub-step of attaching the surface of base surface flattening layer 12 of composite base 1 and the surface of semiconductor crystal body 20 on the side where ion implanted region 20i is located is not particularly limited, and a method such as a direct bonding method in which surfaces to be attached to each other are cleaned and directly attached, and thereafter bonded by being heated to 30° C. to 1000° C., or a surface activation method in which surfaces to be attached to each other are activated by plasma, ions, or the like and bonded, can be suitably used. Thus, a base-crystal bonded body 2A in which semiconductor crystal body 20 is directly bonded to base surface flattening layer 12 of composite base 1 is obtained.

Referring to FIG. 2(D1), a separation method in the sub-step of separating semiconductor crystal body 20 at ion implanted region 20i is not particularly limited, and a method of applying heat and/or stress to attached base-crystal bonded body 2A can be suitably used. With such a method, semiconductor crystal body 20 is separated, at brittle ion implanted region 20i thereof, into semiconductor crystal layer 20a bonded to base surface flattening layer 12 of composite base 1 and a remaining semiconductor crystal body 20b, and thus composite substrate 3A including composite base 1 and semiconductor crystal layer 20a bonded to base surface flattening layer 12 of composite base 1 is efficiently obtained.

(Step of Obtaining Composite Substrate 3B)

Figure 5:
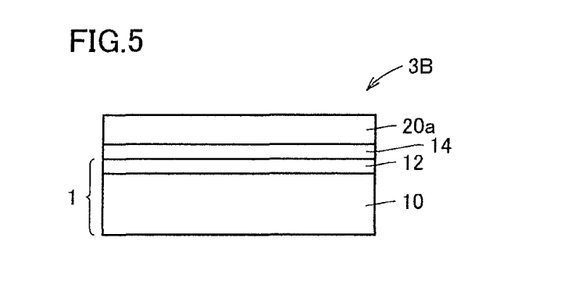
FIG. 5 is a schematic cross sectional view showing another example of the composite substrate in accordance with the present invention.

Referring to FIGS. 2 and 5, composite substrate 3B further includes a bonding layer 14 disposed between base surface flattening layer 12 and semiconductor crystal layer 20a in composite substrate 3A (FIGS. 2 and 4). For example, composite substrate 3B has a form in which base surface flattening layer 12 of composite base 1 and semiconductor crystal layer 20a are bonded with bonding layer 14 interposed therebetween.

Referring to FIG. 2(A2), (B2), (C2), and (D2), the step of obtaining composite substrate 3B is performed by attaching base surface flattening layer 12 and semiconductor crystal layer 20a with bonding layer 14 interposed between base surface flattening layer 12 and semiconductor crystal layer 20a.

Specifically, the step of obtaining composite substrate 3B includes a sub-step of preparing composite base 1 in which a bonding layer 14a is formed on base surface flattening layer 12 (FIG. 2(A2)), a sub-step of preparing semiconductor crystal body 20 in which a bonding layer 14b is formed on a surface and ion implanted region 20i is formed at a predetermined depth from an interface between semiconductor crystal body 20 and bonding layer 14 (FIG. 2(B2)), a sub-step of attaching a surface of bonding layer 14a formed on base surface flattening layer 12 of composite base 1 and a surface of bonding layer 14b formed on semiconductor crystal body 20 described above (FIG. 2(C2)), and a sub-step of separating semiconductor crystal body 20 at ion implanted region 20i (FIG. 2(D2)). It is to be noted that bonding layer 14b formed on semiconductor crystal body 20 can be omitted.

Referring to FIG. 2(A2), in the sub-step of preparing composite base 1 described above, a method of forming bonding layer 14a on base surface flattening layer 12 of composite base 1 is not particularly limited, and the sputtering method, the CVD method, the deposition method, or the like can be suitably used.

Referring to FIG. 2(B2), in the sub-step of preparing semiconductor crystal body 20 described above, a method of forming bonding layer 14b on the surface of semiconductor crystal body 20 is not particularly limited, and the sputtering method, the CVD method, the deposition method, or the like can be suitably used. Further, a method of forming ion implanted region 20i at the predetermined depth from the interface between semiconductor crystal body 20 and bonding layer 14 is performed by implanting ions I from the interface to a region at the predetermined depth in semiconductor crystal body 20. As ions I to be implanted, ions having a small mass number, for example, hydrogen ions, helium ions, or the like are preferable. Ion implanted region 20i in semiconductor crystal body 20 is more brittle than the remaining region due to ion implantation.

Referring to FIG. 2(C2), in the sub-step of attaching the surface of bonding layer 14a formed on base surface flattening layer 12 of composite base 1 and the surface of bonding layer 14b formed on semiconductor crystal body 20 described above, an attachment method such as the direct bonding method, the surface activation method, or the like can be suitably used, as in the foregoing. In such attachment, it is preferable that bonding layer 14a and bonding layer 14b have an identical or approximate chemical composition, from the viewpoint of increasing bondability. When bonding layer 14a and bonding layer 14b having an identical chemical composition are bonded, bonding layer 14 is integrally formed. Thus, a base-crystal bonded body 2B in which semiconductor crystal body 20 is bonded to base surface flattening layer 12 of composite base 1 with bonding layer 14 interposed therebetween is obtained.

Referring to FIG. 2(D2), a separation method in the sub-step of separating semiconductor crystal body 20 at ion implanted region 20i is identical to that in the method of manufacturing composite substrate 3A, and thus will not be repeated here. Consequently, composite substrate 3B including composite base 1, bonding layer 14 bonded to base surface flattening layer 12 of composite base 1, and semiconductor crystal layer 20a bonded to bonding layer 14 is efficiently obtained.

Here, although bonding layer 14 is not particularly limited, it is preferably made of silicon oxide, metal oxide, metal nitride, metal oxynitride, or the like, from the viewpoint of a high effect of improving bondability between base surface flattening layer 12 of composite base 1 and semiconductor crystal layer 20a. In addition, although the thickness of bonding layer 14 is not particularly limited, it is preferably not less than 10 nm and not more than 10000 nm, and more preferably not less than 200 nm and not more than 2000 nm, from the viewpoint of a high effect of improving the bondability between base surface flattening layer 12 and semiconductor crystal layer 20a.

(Step of Obtaining Composite Substrate 3C)

Figure 6:
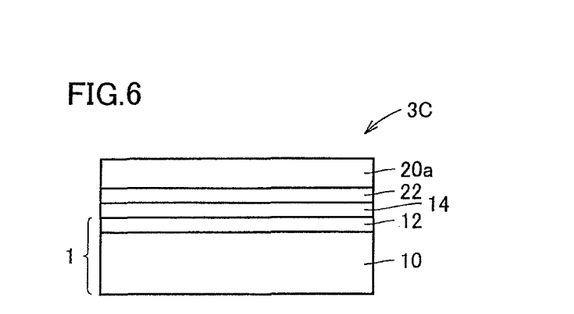
FIG. 6 is a schematic cross sectional view showing still another example of the composite substrate in accordance with the present invention.

Referring to FIGS. 2 and 6, composite substrate 3C further includes a crystal surface flattening layer 22 disposed between semiconductor crystal layer 20a and bonding layer 14 in composite substrate 3B (FIGS. 2 and 5) to be in contact with semiconductor crystal layer 20a. For example, composite substrate 3C has a form in which base surface flattening layer 12 of composite base 1 and crystal surface flattening layer 22 in contact with semiconductor crystal layer 20a are bonded with bonding layer 14 interposed therebetween.

Referring to FIG. 2(A2), (B3), (C3), and (D3), the step of obtaining composite substrate 3C is performed by attaching base surface flattening layer 12 and semiconductor crystal layer 20a with bonding layer 14 and further crystal surface flattening layer 22, which is formed between semiconductor crystal layer 20a and bonding layer 14 to be in contact with semiconductor crystal layer 20a, interposed between base surface flattening layer 12 and semiconductor crystal layer 20a.

Specifically, the step of obtaining composite substrate 3C includes a sub-step of preparing composite base 1 in which bonding layer 14a is formed on base surface flattening layer 12 (FIG. 2(A2)), a sub-step of preparing semiconductor crystal body 20 in which crystal surface flattening layer 22 and bonding layer 14b are formed in this order on a surface and ion implanted region 20i is formed at a predetermined depth from an interface between semiconductor crystal body 20 and crystal surface flattening layer 22 (FIG. 2(B3)), a sub-step of attaching a surface of bonding layer 14a formed on base surface flattening layer 12 of composite base 1 and a surface of bonding layer 14b formed on crystal surface flattening layer 22 formed on semiconductor crystal body 20 described above (FIG. 2(C3)), and a sub-step of separating semiconductor crystal body 20 at ion implanted region 20i (FIG. 2(D3)). It is to be noted that bonding layer 14b formed on semiconductor crystal body 20 can be omitted.

Referring to FIG. 2(A2), the sub-step of preparing composite base 1 described above is identical to that in the step of obtaining composite substrate 3B, and thus will not be repeated here.

Referring to FIG. 2(B3), in the sub-step of preparing semiconductor crystal body 20 described above, a method of forming crystal surface flattening layer 22 on the surface of semiconductor crystal body 20 is not particularly limited, and a gas phase method such as the CVD method, the sputtering method, and the deposition method, a liquid phase method such as the spin coating method and the thermal spraying method, or the like is preferable, from the viewpoint of forming the base surface flattening layer having a small surface RMS roughness. In particular, the spin coating method, the CVD method, or the deposition method is preferable, from the viewpoint of forming the base surface flattening layer having an extremely small surface RMS roughness of about 1.0 nm or smaller. Further, a method of forming bonding layer 14b on a surface of crystal surface flattening layer 22 is not particularly limited, and the sputtering method, the CVD method, the deposition method, or the like can be suitably used. Furthermore, a method of forming ion implanted region 20i at the predetermined depth from the interface between semiconductor crystal body 20 and crystal surface flattening layer 22 is performed by implanting ions I from the interface to a region at the predetermined depth in semiconductor crystal body 20. As ions Ito be implanted, ions having a small mass number, for example, hydrogen ions, helium ions, or the like are preferable. Ion implanted region 20i in semiconductor crystal body 20 is more brittle than the remaining region due to ion implantation.

Here, although crystal surface flattening layer 22 is not particularly limited, it preferably includes at least one selected from the group consisting of silicon oxide, silicon nitride, silicon oxynitride, metal oxide, metal nitride, metal oxynitride, and a metal, from the viewpoint of high surface flatness and high bondability to the bonding layer. Suitable examples of the silicon oxide include $SiO_2$ and the like, suitable examples of the silicon nitride include $Si_3N_4$ and the like, suitable examples of the silicon oxynitride include SiON, suitable examples of the metal oxide include MgO, $Al_2O_3$, $TiO_2$, $Y_2O_3$, and the like, and suitable examples of a composite oxide made of the silicon oxide and the metal oxide include $MgO$—$SiO_2$, $Al_2O_3$—$SiO_2$, $TiO_2$—$SiO_2$, and the like. Suitable examples of the metal nitride include TiN, GaN, AlN, HfN, and the like. Suitable examples of the metal oxynitride include aluminum oxynitride, tantalum oxynitride, and the like. Suitable examples of the metal include Mo, W, Cu, Ta, and the like.

Further, although the thickness of crystal surface flattening layer 22 is not particularly limited, it is preferably not less than 0.1 μm, and more preferably not less than 0.5 μm, from the viewpoint of setting the surface RMS roughness of crystal surface flattening layer 22 disposed in contact with semiconductor crystal layer 20a to as small as not more than 1.0 nm. In addition, the thickness of crystal surface flattening layer 22 is preferably not more than 50 μm, and more preferably not more than 20 μm, from the viewpoint of reducing the cost for forming base surface flattening layer 12.

Referring to FIG. 2(C3), in the sub-step of attaching the surface of bonding layer 14a formed on base surface flattening layer 12 of composite base 1 and the surface of bonding layer 14b formed on crystal surface flattening layer 22 formed on semiconductor crystal body 20 described above, an attachment method such as the direct bonding method, the surface activation method, or the like can be suitably used, as in the foregoing. In such attachment, it is preferable that bonding layer 14a and bonding layer 14b have an identical or approximate chemical composition, from the viewpoint of increasing bondability. When bonding layer 14a and bonding layer 14b having an identical chemical composition are bonded, bonding layer 14 is integrally formed. Thus, a base-crystal bonded body 2C in which semiconductor crystal body 20 on which crystal surface flattening layer 22 is formed is bonded to base surface flattening layer 12 of composite base 1 with bonding layer 14 interposed therebetween is obtained.

Referring to FIG. 2(D3), a separation method in the sub-step of separating semiconductor crystal body 20 at ion implanted region 20i is identical to that in the steps of obtaining composite substrates 3A, 3B, and thus will not be repeated here. Consequently, composite substrate 3C including composite base 1, bonding layer 14 bonded to base surface flattening layer 12 of composite base 1, crystal surface flattening layer 22 bonded to bonding layer 14, and semiconductor crystal layer 20a bonded to crystal surface flattening layer 22 is efficiently obtained.

Although composite substrate 3A, 3B, 3C obtained as described above is not particularly limited, a difference between a thermal expansion coefficient of base 10 and a thermal expansion coefficient of the semiconductor crystal layer is preferably not more than $4.5 \times 10^{-6} K^{-1}$, and more preferably not more than $2.0 \times 10^{-6} K^{-1}$, from the viewpoint of growing a semiconductor layer with high crystallinity on semiconductor crystal layer 20a of composite substrate 3A, 3B, 3C without occurrence of cracks in a later step.

Further, although semiconductor crystal layer 20a is not particularly limited in composite substrate 3A, 3B, 3C, it preferably includes at least one selected from the group consisting of a group III-V compound semiconductor crystal, a group II-VI compound semiconductor crystal, and an oxide semiconductor crystal, from the viewpoint of reducing a used amount of an expensive crystal by formation of the composite substrate, and achieving high effects of resource saving and cost reduction. Suitable examples of the group III-V compound semiconductor crystal include a GaAs crystal, a GaN crystal, an AlN crystal, an $Al_xGa_{1-x}N$ crystal (0<x<1), an $In_yGa_{1-y}N$ crystal (0<y≦1), and the like. Suitable examples of the group II-VI compound semiconductor crystal include a CdSe crystal, a ZnS crystal, and the like. Suitable examples of the oxide semiconductor crystal include a ZnO crystal, an ITO (indium tin oxide) crystal, a $TiO_2$ crystal, and the like.

{Step of Growing Semiconductor Layer}

Referring to FIG. 1(C1), (C2), and (C3), the step of growing semiconductor layer 30 is performed by growing at least one semiconductor layer 30 on semiconductor crystal layer 20a of composite substrate 3A, 3B, 3C. Although a method of growing semiconductor layer 30 is not particularly limited, a gas phase method such as an MOCVD (metalorganic chemical vapor deposition) method, an MBE (molecular beam epitaxy) method, an HVPE (hydride vapor phase epitaxy) method, a sublimation method, a sputtering method, an EB (electron beam) method, a deposition method, and PLD (pulsed laser deposition) method, a liquid phase method such as an LPE (liquid phase epitaxy) method, a flux method, and a sol-gel method, or the like can be suitably used, from the viewpoint of growing semiconductor layer 30 with high crystallinity. Thus, a substrate-semiconductor layer bonded body 4A, 4B, 4C in which at least one semiconductor layer 30 is disposed on semiconductor crystal layer 20a of composite substrate 3A, 3B, 3C is obtained.

{Step of Obtaining Semiconductor Wafer}

Referring to FIG. 1(D1), (D2), and (D3), the step of obtaining semiconductor wafer 5 is performed by removing base surface flattening layer 12 of substrate-semiconductor layer bonded body 4A, 4B, 4C by wet etching and thereby separating semiconductor crystal layer 20a from base 10. Thus, semiconductor wafer 5 including semiconductor crystal layer 20a and semiconductor layer 30 is efficiently obtained.

Here, an etching solution for wet-etching base surface flattening layer 12 can be selected as appropriate depending on the chemical composition of base surface flattening layer 12. For example, if base surface flattening layer 12 includes silicon oxide such as $SiO_2$, silicon nitride such as $Si_3N_4$, or the like, an HF solution or the like can be suitably used as an etching solution. If base surface flattening layer 12 includes a metal such as Mo, an alloy such as Mo—Cu, or the like, an HF—$NNO_3$ mixed solution or the like can be suitably used as an etching solution. If base surface flattening layer 12 includes a metal such as Pt, aqua regia or the like can be suitably used as an etching solution. If base surface flattening layer 12 includes a metal such as Ni, an HCl solution or the like can be suitably used as an etching solution. If base surface flattening layer 12 includes a metal such as Al, an NaOH solution or the like can be suitably used as an etching solution. If base surface flattening layer 12 includes a metal such as W, an $H_2O_2$ solution or the like can be suitably used as an etching solution.

If semiconductor crystal layer 20a and at least one semiconductor layer 30 formed on semiconductor crystal layer 20a are thin and have low mechanical strengths in obtained substrate-semiconductor layer bonded body 4A, 4B, 4C, it is preferable to reinforce semiconductor layer 30 by, for example, attaching a support substrate (not shown) to semiconductor layer 30 before removing base surface flattening layer 12 by wet etching, in order to reinforce the mechanical strength of the semiconductor wafer (formed of semiconductor crystal layer 20a and semiconductor layer 30) obtained by removing base surface flattening layer 12 by wet etching.

[Embodiment 2]

{Composite Base}

Figure 3:
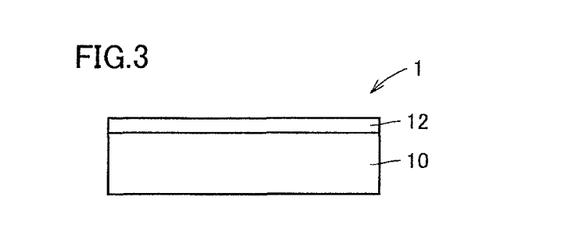
FIG. 3 is a schematic cross sectional view showing an example of a composite base in accordance with the present invention.

Referring to FIG. 3, composite base 1 as another embodiment in accordance with the present invention includes base 10, and base surface flattening layer 12 disposed on base 10. Base surface flattening layer 12 has a surface RMS roughness of not more than 1.0 nm, and a thickness of not less than 0.1 μm and not more than 50 μm. Since base surface flattening layer 12 disposed on base 10 has a surface RMS roughness of not more than 1.0 nm in composite base 1 in the present embodiment, a composite substrate can be obtained by attaching a semiconductor crystal layer to base surface flattening layer 12. Further, since the base surface flattening layer in composite base 1 in the present embodiment has a thickness of not less than 0.1 μm and not more than 50 μm, it can be easily removed by wet etching.

(Base)

Although base 10 in composite base 1 in the present embodiment is not particularly limited, it preferably includes at least one selected from the group consisting of a sintered body and a metal, from the viewpoint that its thermal expansion coefficient can be easily adjusted. Although the sintered body is not particularly limited, it preferably includes at least one selected from the group consisting of silicon oxide and metal oxide. Suitable examples of the silicon oxide include $SiO_2$ and the like, suitable examples of the metal oxide include MgO, $Al_2O_3$, $TiO_2$, and the like, and suitable examples of a composite oxide made of the silicon oxide and the metal oxide include MgO—$SiO_2$, $Al_2O_3$—$SiO_2$, $TiO_2$—$SiO_2$, and the like. In the sintered body, its thermal expansion coefficient can be easily adjusted by changing the chemical composition of the sintered body. The metal is not particularly limited, and includes a single metal and an alloy. Suitable examples of the single metal include Mo, Ta, Ni, Pt, and the like, and suitable examples of the alloy include Mo—Cu, Cu—W, Ni—Cr—Fe, and the like.

(Base Surface Flattening Layer)

Although base surface flattening layer 12 in composite base 1 in the present embodiment is not particularly limited, it preferably includes at least one selected from the group consisting of silicon oxide, silicon nitride, metal oxide, and a metal, from the viewpoint of facilitating wet etching of base surface flattening layer 12 in a later step, and from the viewpoint of high surface flatness and high bondability to the semiconductor crystal layer and the bonding layer. Suitable examples of the silicon oxide include $SiO_2$ and the like, suitable examples of the silicon nitride include $Si_3N_4$ and the like, suitable examples of the metal oxide include MgO, $Al_2O_3$, $TiO_2$, $Y_2O_3$, and the like, and suitable examples of a composite oxide made of the silicon oxide and the metal oxide include MgO—$SiO_2$, $Al_2O_3$—$SiO_2$, $TiO_2$—$SiO_2$, and the like. Further, the metal is not particularly limited, and includes a single metal and an alloy. Suitable examples of the single metal include Mo, Pt, Ni, Al, W, Ta, and the like, and suitable examples of the alloy include Mo—Cu, Cu—W, Ni—Cr—Fe, and the like.

Base surface flattening layer 12 in composite base 1 in the present embodiment is required to have a surface RMS roughness of not more than 1.0 nm, preferably not more than 0.7 nm, and more preferably not more than 0.5 nm, from the viewpoint that a semiconductor crystal layer can be attached thereon, or from the viewpoint that a bonding layer having even and flat surfaces can be formed thereon and further a semiconductor crystal layer can be attached to the bonding layer, in a later step.

Further, although the thickness of base surface flattening layer 12 is not particularly limited, it is preferably not less than 0.1 μm, and more preferably not less than 0.5 μm, from the viewpoint of facilitating wet etching of base surface flattening layer 12 in a later step, and from the viewpoint of setting the surface RMS roughness of base surface flattening layer 12 disposed on base 10 to as small as not more than 1.0 nm when base 10 is a sintered body. In addition, the thickness of base surface flattening layer 12 is preferably not more than 50 μm, and more preferably not more than 20 μm, from the viewpoint of reducing the cost for forming base surface flattening layer 12.

[Embodiment 3]

{Composite Substrate}

Referring to FIGS. 4 to 6, composite substrate 3A, 3B, 3C as still another embodiment of the present invention includes composite base 1 in Embodiment 2, and semiconductor crystal layer 20a disposed on the side of composite base 1 where base surface flattening layer 12 is located. The difference between the thermal expansion coefficient of base 10 and the thermal expansion coefficient of the semiconductor crystal layer is not more than $4.5 \times 10^{-6} K^{-1}$.

Since composite substrate 3A, 3B, 3C in the present embodiment has a high bondability between composite base 1 and semiconductor crystal layer 20a, and has a small difference between the thermal expansion coefficient of base 10 in composite base 1 and the thermal expansion coefficient of semiconductor crystal layer 20a of not more than $4.5 \times 10^{-6}$ $K^{-1}$, a semiconductor layer with high crystallinity can be epitaxially grown on semiconductor crystal layer 20a of composite substrate 3A, 3B, 3C without occurrence of cracks, and thus a semiconductor device with excellent properties can be formed.

Composite substrates 3A, 3B, 3C in the present embodiment take several different concrete forms, depending on differences in the bonding form between composite base 1 and semiconductor crystal layer 20a. Their concrete forms will be each described below.

(Composite Substrate 3A)

Referring to FIG. 4, composite substrate 3A includes composite base 1, and semiconductor crystal layer 20a disposed on base surface flattening layer 12 of composite base 1. For example, composite substrate 3A has a form in which base surface flattening layer 12 of composite base 1 and semiconductor crystal layer 20a are directly bonded to each other. In such composite substrate 3A, base 10 and semiconductor crystal layer 20a can be bonded by base surface flattening layer 12 disposed on base 10, even if base 10 is formed of a sintered body for which it is difficult to reduce a surface RMS roughness even by polishing.

(Composite Substrate 3B)

Referring to FIG. 5, composite substrate 3B further includes bonding layer 14 disposed between base surface flattening layer 12 and semiconductor crystal layer 20a in composite substrate 3A (FIG. 3). For example, composite substrate 3B has a form in which base surface flattening layer 12 of composite base 1 and semiconductor crystal layer 20a are bonded with bonding layer 14 interposed therebetween. In such composite substrate 3B, bondability between base surface flattening layer 12 of composite base 1 and semiconductor crystal layer 20a is improved by bonding layer 14.

Here, although bonding layer 14 is not particularly limited, it is preferably made of silicon oxide, metal oxide, metal nitride, metal oxynitride, or the like, from the viewpoint of a high effect of improving the bondability between base surface flattening layer 12 of composite base 1 and semiconductor crystal layer 20a. In addition, although the thickness of bonding layer 14 is not particularly limited, it is preferably not less than 10 nm and not more than 10000 nm, and more preferably not less than 200 nm and not more than 2000 nm, from the viewpoint of a high effect of improving the bondability between base surface flattening layer 12 and semiconductor crystal layer 20a.

(Composite Substrate 3C)

Referring to FIG. 6, composite substrate 3C further includes crystal surface flattening layer 22 disposed between semiconductor crystal layer 20a and bonding layer 14 in composite substrate 3B (FIG. 5) to be in contact with semiconductor crystal layer 20a. For example, composite substrate 3C has a form in which base surface flattening layer 12 of composite base 1 and crystal surface flattening layer 22 in contact with semiconductor crystal layer 20a are bonded with bonding layer 14 interposed therebetween. In such composite substrate 3C, the bondability between base surface flattening layer 12 of composite base 1 and semiconductor crystal layer 20a is further improved by bonding layer 14 and crystal surface flattening layer 22.

Here, although crystal surface flattening layer 22 is not particularly limited, it preferably includes at least one selected from the group consisting of silicon oxide, silicon nitride, silicon oxynitride, metal oxide, metal nitride, metal oxynitride, and a metal, from the viewpoint of high surface flatness and high bondability to the bonding layer. Suitable examples of the silicon oxide include $SiO_2$ and the like, suitable examples of the silicon nitride include $Si_3N_4$ and the like, suitable examples of the silicon oxynitride include SiON and the like, suitable examples of the metal oxide include MgO, $Al_2O_3$, $TiO_2$, $Y_2O_3$, and the like, and suitable examples of a composite oxide made of the silicon oxide and the metal oxide include $MgO-SiO_2$, $Al_2O_3-SiO_2$, $TiO_2-SiO_2$, and the like. Suitable examples of the metal nitride include TiN, GaN, AlN, HfN, and the like. Suitable examples of the metal oxynitride include aluminum oxynitride, tantalum oxynitride, and the like. Suitable examples of the metal include Mo, W, Cu, Ta, and the like.

Further, although the thickness of crystal surface flattening layer 22 is not particularly limited, it is preferably not less than 0.1 μm, and more preferably not less than 0.5 μm, from the viewpoint of setting the surface RMS roughness of crystal surface flattening layer 22 disposed in contact with semiconductor crystal layer 20a to as small as not more than 1.0 nm. In addition, the thickness of crystal surface flattening layer 22 is preferably not more than 50 μm, and more preferably not more than 20 μm, from the viewpoint of reducing the cost for forming base surface flattening layer 12.

Further, although semiconductor crystal layer 20a is not particularly limited in composite substrate 3A, 3B, 3C, it preferably includes at least one selected from the group consisting of a group III-V compound semiconductor crystal, a group II-VI compound semiconductor crystal, and an oxide semiconductor crystal, from the viewpoint of reducing a used amount of an expensive crystal by formation of the composite substrate, and achieving high effects of resource saving and cost reduction. Suitable examples of the group III-V compound semiconductor crystal include a GaAs crystal, a GaN crystal, an AlN crystal, an $Al_xGa_{1-x}N$ crystal (0<x<1), an $In_yGa_{1-y}N$ crystal (0<y≦1), and the like. Suitable examples of the group II-VI compound semiconductor crystal include a CdSe crystal, a ZnS crystal, and the like. Suitable examples of the oxide semiconductor crystal include a ZnO crystal, an ITO (indium tin oxide) crystal, a $TiO_2$ crystal, and the like.

EXAMPLE 1

1. Fabrication of Composite Base

Referring to FIG. 1(A), a high-density $Al_2O_3-SiO_2$ sintered base (relative density: 98% by mass) with a diameter of four inches (101.6 mm) and a thickness of 500 μm was prepared as base 10. A surface of the high-density $Al_2O_3-SiO_2$ sintered base was mechanically polished (with diamond abrasive grains) to obtain a surface RMS roughness of 20 nm. Here, the surface RMS roughness was measured using an AFM.

Next, a 20 μm-thick $SiO_2$ layer was formed as base surface flattening layer 12 on the high-density $Al_2O_3-SiO_2$ sintered base (base 10) by the CVD (chemical vapor deposition) method, and thereby composite base 1 including the 20 μm-thick $SiO_2$ layer (base surface flattening layer 12) disposed on the high-density $Al_2O_3-SiO_2$ sintered base (base 10) was obtained. As a material for the $SiO_2$ layer, TEOS (tetraethoxysilane) was used. A surface of the $SiO_2$ layer (base surface flattening layer 12) of obtained composite base 1 was subjected to mechanical polishing and CMP (chemical mechanical polishing), and thus a small surface RMS roughness of 0.6 nm was able to be obtained.

2. Fabrication of Composite Substrate

Next, referring to FIG. 2(A1) and (A2), a 100 nm-thick $SiO_2$ layer (bonding layer 14a) was formed on the $SiO_2$ layer (base surface flattening layer 12) of composite base 1 by the CVD method.

Further, referring to FIG. 2(B2), on a surface of a GaN crystal body with a diameter of four inches and a thickness of 500 μm as semiconductor crystal body 20, a 100 nm-thick $SiO_2$ layer (bonding layer 14b) was formed by the CVD method, and hydrogen ions were implanted into the GaN crystal body (semiconductor crystal body 20) at a depth of about 150 nm from an interface between the GaN crystal body (semiconductor crystal body 20) and the $SiO_2$ layer (bonding layer 14b).

Next, referring to FIG. 2(C2), surfaces of the $SiO_2$ layer (bonding layer 14b) and the $SiO_2$ layer (bonding layer 14b) described above were subjected to CMP (chemical mechanical polishing) to have an RMS roughness of 0.5 nm, and cleaned by oxygen plasma treatment. Thereafter, the surfaces were overlapped with each other, attached by applying pressure thereto under a load of 7 MPa at room temperature (25° C.), to obtain base-crystal bonded body 2B. Obtained base-crystal bonded body 2B was slowly heated from room temperature (25° C.) to 300° C. over three hours to increase bonding strength. By such bonding, the two $SiO_2$ layers (bonding layers 14a, 14b) were integrated to form a 200 nm-thick $SiO_2$ layer (bonding layer 14).

Subsequently, referring to FIG. 2(D2), base-crystal bonded body 2B was heated to 500° C. and subjected to stress, and thereby the GaN crystal body (semiconductor crystal body 20) was separated, at ion implanted region 20i thereof, into a GaN crystal layer (semiconductor crystal layer 20a) and the remaining GaN crystal body (remaining semiconductor crystal body 20b). Thus, composite substrate 3B in which the 150 nm-thick GaN crystal layer (semiconductor crystal layer 20a) was bonded on the 20 μm-thick $SiO_2$ layer (base surface flattening layer 12) of composite base 1 with the 200 nm-thick $SiO_2$ layer (bonding layer 14) interposed therebetween was obtained (see FIG. 1(B2)).

3. Fabrication of Semiconductor Wafer

Next, referring to FIG. 1(C2), a 100 μm-thick GaN layer as at least one semiconductor layer 30 was epitaxially grown on the GaN crystal layer (semiconductor crystal layer 20a) of composite substrate 3B by the HVPE (hydride vapor phase epitaxy) method, to obtain substrate-semiconductor layer bonded body 4B.

Subsequently, referring to FIG. 1(D2), substrate-semiconductor layer bonded body 4B was immersed in a 25% by mass HF aqueous solution. Twenty-one minutes later, the 20 μm-thick $SiO_2$ layer (base surface flattening layer 12) and the 200 nm-thick $SiO_2$ layer (bonding layer 14) were removed by wet etching, and semiconductor wafer 5 in which the 150-nm thick GaN crystal layer (semiconductor crystal layer 20a) and the 100 μm-thick GaN layer were stacked was obtained. Table 1 shows the result.

EXAMPLE 2

Composite base 1 was fabricated as in Example 1, except that a 20 μm-thick $SiO_2$ layer was formed as base surface flattening layer 12 by the spin coating method. Specifically, formation of the $SiO_2$ layer (base surface flattening layer 12) was performed by applying Si alkoxide (a methylsiloxane polymer) as a raw material for the $SiO_2$ layer on the high-density $Al_2O_3-SiO_2$ sintered base (base 10) by spin coating, and performing heat treatment at 400° C. A surface of the $SiO_2$ layer (base surface flattening layer 12) of obtained composite base 1 was subjected to mechanical polishing and CMP (chemical mechanical polishing), and thus a small surface RMS roughness of 0.6 nm was able to be obtained.

Next, composite substrate 3B was fabricated, and then substrate-semiconductor layer bonded body 4B was fabricated, as in Example 1.

Obtained substrate-semiconductor layer bonded body 4B was immersed in a 25% by mass HF aqueous solution. Twenty-two minutes later, the 20 μm-thick $SiO_2$ layer (base surface flattening layer 12) and the 200 nm-thick $SiO_2$ layer (bonding layer 14) were removed by wet etching, and semiconductor wafer 5 in which the 150 nm-thick GaN crystal layer (semiconductor crystal layer 20a) and the 100 μm-thick GaN layer were stacked was obtained. Table 1 shows the result.

EXAMPLE 3

Composite base 1 was fabricated as in Example 1, except that a 20 μm-thick $SiO_2$ layer was formed as base surface flattening layer 12 by thermal spraying using a plasma powder spraying method (plasma spraying). A surface of the $SiO_2$ layer (base surface flattening layer 12) of obtained composite base 1 was subjected to mechanical polishing and CMP (chemical mechanical polishing), and thus a small surface RMS roughness of 0.6 nm was able to be obtained.

Next, composite substrate 3B was fabricated, and then substrate-semiconductor layer bonded body 4B was fabricated, as in Example 1.

Obtained substrate-semiconductor layer bonded body 4B was immersed in a 25% by mass HF aqueous solution. Eighteen minutes later, the 20 μm-thick $SiO_2$ layer (base surface flattening layer 12) and the 200 nm-thick $SiO_2$ layer (bonding layer 14) were removed by wet etching, and semiconductor wafer 5 in which the 150 nm-thick GaN crystal layer (semiconductor crystal layer 20a) and the 100 μm-thick GaN layer were stacked was obtained. Table 1 shows the result.

EXAMPLE 4

Composite base 1 was fabricated as in Example 1, except that a 15 μm-thick Mo layer was formed as base surface flattening layer 12 by the thermal spraying method. A surface of the Mo layer (base surface flattening layer 12) of obtained composite base 1 was subjected to mechanical polishing and CMP (chemical mechanical polishing), and thus a small surface RMS roughness of 0.5 nm was able to be obtained.

Next, composite substrate 3B was fabricated, and then substrate-semiconductor layer bonded body 4B was fabricated, as in Example 1.

Obtained substrate-semiconductor layer bonded body 4B was immersed in an aqueous solution containing 25% by mass of HF and 10% by mass of $HNO_3$. Thirty-five minutes later, the 15 μm-thick Mo layer (base surface flattening layer 12) and the 200 nm-thick $SiO_2$ layer (bonding layer 14) were removed by wet etching, and semiconductor wafer 5 in which the 150 nm-thick GaN crystal layer (semiconductor crystal layer 20a) and the 100 μm-thick GaN layer were stacked was obtained. Table 1 shows the result.

EXAMPLE 5

Composite base 1 was fabricated as in Example 1, except that a 15 μm-thick Mo—Cu layer was formed as base surface flattening layer 12 by the thermal spraying method. A surface of the Mo—Cu layer (base surface flattening layer 12) of obtained composite base 1 was subjected to mechanical polishing and CMP (chemical mechanical polishing), and thus a small surface RMS roughness of 0.6 nm was able to be obtained.

Next, composite substrate 3B was fabricated, and then substrate-semiconductor layer bonded body 4B was fabricated, as in Example 1.

Obtained substrate-semiconductor layer bonded body 4B was immersed in an aqueous solution containing 25% by mass of HF and 10% by mass of $HNO_3$. Thirty-two minutes later, the 15 μm-thick Mo—Cu layer (base surface flattening layer 12) and the 200 nm-thick $SiO_2$ layer (bonding layer 14) were removed by wet etching, and semiconductor wafer 5 in which the 150 nm-thick GaN crystal layer (semiconductor crystal layer 20a) and the 100 μm-thick GaN layer were stacked was obtained. Table 1 shows the result.

EXAMPLE 6

Composite base 1 was fabricated as in Example 1, except that a 15 μm-thick Pt layer was formed as base surface flattening layer 12 by the deposition method. A surface of the Pt layer (base surface flattening layer 12) of obtained composite base 1 was subjected to mechanical polishing and CMP (chemical mechanical polishing), and thus a small surface RMS roughness of 0.6 nm was able to be obtained.

Next, composite substrate 3B was fabricated, and then substrate-semiconductor layer bonded body 4B was fabricated, as in Example 1.

Obtained substrate-semiconductor layer bonded body 4B was immersed in aqua regia. Seventeen minutes later, the 20 μm-thick Pt layer (base surface flattening layer 12) was removed by wet etching, and a wafer in which the 200 nm-thick $SiO_2$ layer (bonding layer 14), the 150 nm-thick GaN crystal layer (semiconductor crystal layer 20a), and the 100 μm-thick GaN layer were stacked was obtained. The wafer was immersed in a 25% by mass HF aqueous solution to remove the 200 nm-thick $SiO_2$ layer (bonding layer 14), and thereby semiconductor wafer 5 in which the 150 nm-thick GaN crystal layer (semiconductor crystal layer 20a) and the 100 μm-thick GaN layer were stacked was obtained. Table 1 shows the result.

EXAMPLE 7

Composite base 1 was fabricated as in Example 1, except that a 15 μm-thick Ni layer was formed as base surface flattening layer 12 by the deposition method. A surface of the Ni layer (base surface flattening layer 12) of obtained composite base 1 was subjected to mechanical polishing and CMP (chemical mechanical polishing), and thus a small surface RMS roughness of 0.6 nm was able to be obtained.

Next, composite substrate 3B was fabricated, and then substrate-semiconductor layer bonded body 4B was fabricated, as in Example 1.

Obtained substrate-semiconductor layer bonded body 4B was immersed in a 25% by mass HCl aqueous solution. Eighteen minutes later, the 15 μm-thick Ni layer (base surface flattening layer 12) was removed by wet etching, and a wafer in which the 200 nm-thick $SiO_2$ layer (bonding layer 14), the 150 nm-thick GaN crystal layer (semiconductor crystal layer 20a), and the 100 μm-thick GaN layer were stacked was obtained. The wafer was immersed in a 25% by mass HF aqueous solution to remove the 200 nm-thick $SiO_2$ layer (bonding layer 14), and thereby semiconductor wafer 5 in which the 150 nm-thick GaN crystal layer (semiconductor crystal layer 20a) and the 100 μm-thick GaN layer were stacked was obtained. Table 1 shows the result.

EXAMPLE 8

Composite base 1 was fabricated as in Example 1, except that a 15 μm-thick Al layer was formed as base surface flattening layer 12 by the deposition method. A surface of the Al layer (base surface flattening layer 12) of obtained composite base 1 was subjected to mechanical polishing and CMP (chemical mechanical polishing), and thus a small surface RMS roughness of 0.3 nm was able to be obtained.

Next, composite substrate 3B was fabricated, and then substrate-semiconductor layer bonded body 4B was fabricated, as in Example 1.

Obtained substrate-semiconductor layer bonded body 4B was immersed in a 10% by mass NaOH aqueous solution. Twenty minutes later, the 15 μm-thick Al layer (base surface flattening layer 12) was removed by wet etching, and a wafer in which the 200 nm-thick $SiO_2$ layer (bonding layer 14), the 150 nm-thick GaN crystal layer (semiconductor crystal layer 20a), and the 100 μm-thick GaN layer were stacked was obtained. The wafer was immersed in a 25% by mass HF aqueous solution to remove the 200 nm-thick $SiO_2$ layer (bonding layer 14), and thereby semiconductor wafer 5 in which the 150 nm-thick GaN crystal layer (semiconductor crystal layer 20a) and the 100 μm-thick GaN layer were stacked was obtained. Table 1 shows the result.

EXAMPLE 9

Composite base 1 was fabricated as in Example 1, except that a 15 μm-thick W layer was formed as base surface flattening layer 12 by the thermal spraying method. A surface of the W layer (base surface flattening layer 12) of obtained composite base 1 was subjected to mechanical polishing and CMP (chemical mechanical polishing), and thus a small surface RMS roughness of 0.6 nm was able to be obtained.

Next, composite substrate 3B was fabricated, and then substrate-semiconductor layer bonded body 4B was fabricated, as in Example 1.

Obtained substrate-semiconductor layer bonded body 4B was immersed in a 30% by mass $H_2O_2$ aqueous solution. Thirty-five minutes later, the 15 μm-thick W layer (base surface flattening layer 12) was removed by wet etching, and a wafer in which the 200 nm-thick $SiO_2$ layer (bonding layer 14), the 150 nm-thick GaN crystal layer (semiconductor crystal layer 20a), and the 100 μm-thick GaN layer were stacked was obtained. The wafer was immersed in a 25% by mass HF aqueous solution to remove the 200 nm-thick $SiO_2$ layer (bonding layer 14), and thereby semiconductor wafer 5 in which the 150 nm-thick GaN crystal layer (semiconductor crystal layer 20a) and the 100 μm-thick GaN layer were stacked was obtained. Table 1 shows the result.

EXAMPLE 10

Composite base 1 was fabricated as in Example 1, except that the surface of the high-density $Al_2O_3$—$SiO_2$ sintered base as base 10 was mechanically polished (with diamond abrasive grains) to obtain a surface RMS roughness of 8.3 nm, and that a 0.5 μm-thick $SiO_2$ layer was formed as base surface flattening layer 12 by the spin coating method as in Example 2. A surface of the $SiO_2$ layer (base surface flattening layer 12) of obtained composite base 1 was subjected to mechanical polishing and CMP (chemical mechanical polishing), and thus a small surface RMS roughness of 0.6 nm was able to be obtained.

Next, composite substrate 3B was fabricated, and then substrate-semiconductor layer bonded body 4B was fabricated, as in Example 1.

Obtained substrate-semiconductor layer bonded body 4B was immersed in a 25% by mass HF aqueous solution. Sixty-eight minutes later, the 0.5 μm-thick $SiO_2$ layer (base surface flattening layer 12) and the 200 nm-thick $SiO_2$ layer (bonding layer 14) were removed by wet etching, and semiconductor wafer 5 in which the 150 nm-thick GaN crystal layer (semiconductor crystal layer 20a) and the 100 mm-thick GaN layer were stacked was obtained. Table 1 shows the result.

EXAMPLE 11

Composite base 1 was fabricated as in Example 10, except that a 1 μm-thick $SiO_2$ layer was formed as base surface flattening layer 12 by the spin coating method as in Example 2. A surface of the $SiO_2$ layer (base surface flattening layer 12) of obtained composite base 1 was subjected to mechanical polishing and CMP (chemical mechanical polishing), and thus a small surface RMS roughness of 0.6 nm was able to be obtained.

Next, composite substrate 3B was fabricated, and then substrate-semiconductor layer bonded body 4B was fabricated, as in Example 1.

Obtained substrate-semiconductor layer bonded body 4B was immersed in a 25% by mass HF aqueous solution. Sixty-three minutes later, the 1 μm-thick $SiO_2$ layer (base surface flattening layer 12) and the 200 nm-thick $SiO_2$ layer (bonding layer 14) were removed by wet etching, and semiconductor wafer 5 in which the 150 nm-thick GaN crystal layer (semiconductor crystal layer 20a) and the 100 μm-thick GaN layer were stacked was obtained. Table 1 shows the result.

EXAMPLE 12

Composite base 1 was fabricated as in Example 10, except that a 10 μm-thick $SiO_2$ layer was formed as base surface flattening layer 12 by the spin coating method as in Example 2. A surface of the $SiO_2$ layer (base surface flattening layer 12) of obtained composite base 1 was subjected to mechanical polishing and CMP (chemical mechanical polishing), and thus a small surface RMS roughness of 0.6 nm was able to be obtained.

Next, composite substrate 3B was fabricated, and then substrate-semiconductor layer bonded body 4B was fabricated, as in Example 1.

Obtained substrate-semiconductor layer bonded body 4B was immersed in a 25% by mass HF aqueous solution. Forty-three minutes later, the 10 μm-thick $SiO_2$ layer (base surface flattening layer 12) and the 200 nm-thick $SiO_2$ layer (bonding layer 14) were removed by wet etching, and semiconductor wafer 5 in which the 150 nm-thick GaN crystal layer (semiconductor crystal layer 20a) and the 100 μm-thick GaN layer were stacked was obtained. Table 1 shows the result.

EXAMPLE 13

Composite base 1 was fabricated as in Example 10, except that a 1.5 μm-thick $Si_3N_4$ layer was formed as base surface flattening layer 12 by the CVD method. A surface of the $Si_3N_4$ layer (base surface flattening layer 12) of obtained composite base 1 was subjected to mechanical polishing and CMP (chemical mechanical polishing), and thus a small surface RMS roughness of 0.5 nm was able to be obtained.

Next, composite substrate 3B was fabricated, and then substrate-semiconductor layer bonded body 4B was fabricated, as in Example 1.

Obtained substrate-semiconductor layer bonded body 4B was immersed in a 25% by mass HF aqueous solution. Fifty-eight minutes later, the 1.5 μm-thick $Si_3N_4$ layer (base surface flattening layer 12) and the 200 nm-thick $SiO_2$ layer (bonding layer 14) were removed by wet etching, and semiconductor wafer 5 in which the 150 nm-thick GaN crystal layer (semiconductor crystal layer 20a) and the 100 μm-thick GaN layer were stacked was obtained. Table 1 shows the result.

EXAMPLE 14

1. Fabrication of Composite Base

Referring to FIGS. 1(A) and 2(A1), a high-density $Al_2O_3$—$SiO_2$ sintered base (relative density: 98% by mass) with a diameter of four inches (101.6 mm) and a thickness of 500 μm was prepared as base 10. A surface of the high-density $Al_2O_3$—$SiO_2$ sintered base was mechanically polished (with diamond abrasive grains) to obtain a surface RMS roughness of 8.3 nm.

Next, a 1 μm-thick $SiO_2$ layer was formed as base surface flattening layer 12 on the high-density $Al_2O_3$—$SiO_2$ sintered base (base 10) by the spin coating method as in Example 2, and thereby composite base 1 including the 1 μm-thick $SiO_2$ layer (base surface flattening layer 12) disposed on the high-density $Al_2O_3$—$SiO_2$ sintered base (base 10) was obtained. A surface of the $SiO_2$ layer (base surface flattening layer 12) of obtained composite base 1 was subjected to mechanical polishing and CMP (chemical mechanical polishing), and thus a small surface RMS roughness of 0.6 nm was able to be obtained.

2. Fabrication of Composite Substrate

Subsequently, referring to FIG. 2(B1), hydrogen ions were implanted into a GaN crystal body with a diameter of four inches and a thickness of 500 μm as semiconductor crystal body 20 at a depth of about 150 nm from a surface of the GaN crystal body (semiconductor crystal body 20).

Next, referring to FIG. 2(C1), the surface of the $SiO_2$ layer (base surface flattening layer 12) and the surface of semiconductor crystal body 20 from which the ions were implanted described above were subjected to CMP (chemical mechanical polishing) to have an RMS roughness of 0.5 nm, and cleaned by oxygen plasma treatment. Thereafter, the surfaces were overlapped with each other, attached by applying pressure thereto under a load of 7 MPa at room temperature (25° C.), to obtain base-crystal bonded body 2A. Obtained base-crystal bonded body 2B was slowly heated from room temperature (25° C.) to 300° C. over three hours to increase bonding strength.

Then, referring to FIG. 2(D1), base-crystal bonded body 2A was heated to 500° C. and subjected to stress, and thereby the GaN crystal body (semiconductor crystal body 20) was separated, at ion implanted region 20i thereof, into a GaN crystal layer (semiconductor crystal layer 20a) and the remaining GaN crystal body (remaining semiconductor crystal body 20b). Thus, composite substrate 3A in which the 150 nm-thick GaN crystal layer (semiconductor crystal layer 20a) was directly bonded on the 1 μm-thick $SiO_2$ layer (base surface flattening layer 12) of composite base 1 was obtained (see FIG. 1(B1)).

3. Fabrication of Semiconductor Wafer

Next, referring to FIG. 1(C1), a 100 μm-thick GaN layer as at least one semiconductor layer 30 was epitaxially grown on the GaN crystal layer (semiconductor crystal layer 20a) of composite substrate 3A by the HVPE (hydride vapor phase epitaxy) method, to obtain substrate-semiconductor layer bonded body 4A.

Subsequently, referring to FIG. 1(D1), substrate-semiconductor layer bonded body 4A was immersed in a 25% by mass HF aqueous solution. Sixty-five minutes later, the 1 μm-thick $SiO_2$ layer (base surface flattening layer 12) and the 200 nm-thick $SiO_2$ layer (bonding layer 14) were removed by wet etching, and semiconductor wafer 5 in which the 150 nm-thick GaN crystal layer (semiconductor crystal layer 20a) and the 100 μm-thick GaN layer were stacked was obtained. Table 1 shows the result.

EXAMPLE 15

1. Fabrication of Composite Base

Referring to FIG. 1(A), a high-density $Al_2O_3$—$SiO_2$ sintered base (relative density: 98% by mass) with a diameter of four inches (101.6 mm) and a thickness of 500 μm was prepared as base 10. A surface of the high-density $Al_2O_3$—$SiO_2$ sintered base was mechanically polished (with diamond abrasive grains) to obtain a surface RMS roughness of 8.3 nm.

Next, a 1 μm-thick $SiO_2$ layer was formed as base surface flattening layer 12 on the high-density $Al_2O_3$—$SiO_2$ sintered base (base 10) by the spin coating method as in Example 2, and thereby composite base 1 including the 1 μm-thick $SiO_2$ layer (base surface flattening layer 12) disposed on the high-density $Al_2O_3$—$SiO_2$ sintered base (base 10) was obtained. A surface of the $SiO_2$ layer (base surface flattening layer 12) of obtained composite base 1 was subjected to mechanical polishing and CMP (chemical mechanical polishing), and thus a small surface RMS roughness of 0.6 nm was able to be obtained.

2. Fabrication of Composite Substrate

Next, referring to FIG. 2(A1) and (A2), a 100 nm-thick $SiO_2$ layer (bonding layer 14a) was formed on the $SiO_2$ layer (base surface flattening layer 12) of composite base 1 by the CVD method.

Further, referring to FIG. 2(B3), on a surface of a GaN crystal body with a diameter of four inches and a thickness of 500 μm as semiconductor crystal body 20, a 1 μm-thick $SiO_2$ layer was formed as crystal surface flattening layer 22 by the spin coating method as in Example 2. Then, on crystal surface flattening layer 22, a 100 nm-thick $SiO_2$ layer (bonding layer 14b) was formed by the CVD method. Subsequently, hydrogen ions were implanted into the GaN crystal body (semiconductor crystal body 20) at a depth of about 150 nm from an interface between the GaN crystal body (semiconductor crystal body 20) and the $SiO_2$ layer (crystal surface flattening layer 22).

Next, referring to FIG. 2(C3), surfaces of the $SiO_2$ layer (bonding layer 14a) and the $SiO_2$ layer (bonding layer 14b) described above were subjected to CMP (chemical mechanical polishing) to have an RMS roughness of 0.5 nm, and cleaned by oxygen plasma treatment. Thereafter, the surfaces were overlapped with each other, attached by applying pressure thereto under a load of 7 MPa at room temperature (25° C.), to obtain base-crystal bonded body 2C. Obtained base-crystal bonded body 2C was slowly heated from room temperature (25° C.) to 300° C. over three hours to increase bonding strength. By such bonding, the two $SiO_2$ layers (bonding layers 14a, 14b) were integrated to form a 200 nm-thick $SiO_2$ layer (bonding layer 14).

Subsequently, referring to FIG. 2(D3), base-crystal bonded body 2C was heated to 500° C. and subjected to stress, and thereby the GaN crystal body (semiconductor crystal body 20) was separated, at ion implanted region 20i thereof, into a GaN crystal layer (semiconductor crystal layer 20a) and the remaining GaN crystal body (remaining semiconductor crystal body 20b). Thus, composite substrate 3C in which the 150 nm-thick GaN crystal layer (semiconductor crystal layer 20a) on which the 1 μm-thick SiO₂ layer (crystal surface flattening layer 22) was formed was bonded on the 1 μm-thick SiO₂ layer (base surface flattening layer 12) of composite base 1 with the 200 nm-thick SiO₂ layer (bonding layer 14) interposed therebetween was obtained (see FIG. 1(B3)).

3. Fabrication of Semiconductor Wafer

Next, referring to FIG. 1(C3), a 100 μm-thick GaN layer as at least one semiconductor layer 30 was epitaxially grown on the GaN crystal layer (semiconductor crystal layer 20a) of composite substrate 3C by the HVPE (hydride vapor phase epitaxy) method, to obtain substrate-semiconductor layer bonded body 4C.

Subsequently, referring to FIG. 1(D2), substrate-semiconductor layer bonded body 4C was immersed in a 25% by mass HF aqueous solution. Sixty-five minutes later, the 1 μm-thick SiO₂ layer (base surface flattening layer 12), the 200 nm-thick SiO₂ layer (bonding layer 14), and the 1 μm-thick SiO₂ layer (crystal surface flattening layer 22) were removed by wet etching, and semiconductor wafer 5 in which the 150 nm-thick GaN crystal layer (semiconductor crystal layer 20a) and the 100 μm-thick GaN layer were stacked was obtained. Table 1 shows the result.

way of illustration and example only and is not to be taken by way of limitation, the scope of the present invention being interpreted by the terms of the appended claims.

What is claimed is:

1. A method of manufacturing a semiconductor wafer, comprising the steps of:
    obtaining a composite base by forming a base surface flattening layer having a surface RMS roughness of not more than 1.0 nm on a base;
    obtaining a composite substrate by attaching a semiconductor crystal layer to a side of said composite base where said base surface flattening layer is located;
    growing at least one semiconductor layer on said semiconductor crystal layer of said composite substrate; and
    obtaining the semiconductor wafer including said semiconductor crystal layer and said semiconductor layer by removing said base surface flattening layer by wet etching and thereby separating said semiconductor crystal layer from said base.

2. The method of manufacturing a semiconductor wafer according to claim 1, wherein said base surface flattening layer has a thickness of not less than 0.1 μm and not more than 50 μm.

3. The method of manufacturing a semiconductor wafer according to claim 1, wherein said base surface flattening layer includes at least one selected from the group consisting of silicon oxide, silicon nitride, metal oxide, and a metal.

TABLE 1

| | Base | | Base Surface Flattening Layer | | | | Separation Step | |
|---|---|---|---|---|---|---|---|---|
| | Material | Surface RMS Roughness (nm) | Material | Film Formation Method | Thickness (μm) | Surface RMS Roughness after Polishing (nm) | Etching Solution | Etching Time (min) |
| Example 1 | Al₂O₃—SiO₂ | 20 | SiO₂ | CVD | 20 | 0.6 | HF | 21 |
| Example 2 | Al₂O₃—SiO₂ | 20 | SiO₂ | Spin Coating | 20 | 0.6 | HF | 22 |
| Example 3 | Al₂O₃—SiO₂ | 20 | SiO₂ | Thermal Spraying | 20 | 0.6 | HF | 18 |
| Example 4 | Al₂O₃—SiO₂ | 20 | Mo | Thermal Spraying | 15 | 0.5 | HF&HNO₃ | 35 |
| Example 5 | Al₂O₃—SiO₂ | 20 | Mo—Cu | Thermal Spraying | 15 | 0.6 | HF&HNO₃ | 32 |
| Example 6 | Al₂O₃—SiO₂ | 20 | Pt | Deposition | 15 | 0.6 | Aqua Regia | 17 |
| Example 7 | Al₂O₃—SiO₂ | 20 | Ni | Deposition | 15 | 0.6 | HCl | 18 |
| Example 8 | Al₂O₃—SiO₂ | 20 | Al | Deposition | 15 | 0.3 | NaOH | 20 |
| Example 9 | Al₂O₃—SiO₂ | 20 | W | Thermal Spraying | 15 | 0.6 | H₂O₂ | 35 |
| Example 10 | Al₂O₃—SiO₂ | 8.3 | SiO₂ | Spin Coating | 0.5 | 0.6 | HF | 68 |
| Example 11 | Al₂O₃—SiO₂ | 8.3 | SiO₂ | Spin Coating | 1 | 0.6 | HF | 63 |
| Example 12 | Al₂O₃—SiO₂ | 8.3 | SiO₂ | Spin Coating | 10 | 0.6 | HF | 43 |
| Example 13 | Al₂O₃—SiO₂ | 8.3 | Si₃N₄ | CVD | 1.5 | 0.5 | HF | 58 |
| Example 14 | Al₂O₃—SiO₂ | 8.3 | SiO₂ | Spin Coating | 1 | 0.6 | HF | 65 |
| Example 15 | Al₂O₃—SiO₂ | 8.3 | SiO₂ | Spin Coating | 1 | 0.6 | HF | 65 |

As is clear from Table 1, according to a method of manufacturing a semiconductor wafer, including the steps of: obtaining a composite base by forming, on a base, a base surface flattening layer having a surface RMS roughness of not more than 1.0 nm and a thickness of not less than 0.1 μm and not more than 50 μm; obtaining a composite substrate by attaching a semiconductor crystal layer to a side of the composite base where the base surface flattening layer is located; growing at least one semiconductor layer on the semiconductor crystal layer of the composite substrate; and obtaining the semiconductor wafer including the semiconductor crystal layer and the semiconductor layer by removing the base surface flattening layer by wet etching and thereby separating the semiconductor crystal layer from the base, it was possible to fabricate a suitable composite substrate, and to efficiently fabricate a semiconductor device by efficiently removing the base surface flattening layer by wet etching.

Although the present invention has been described and illustrated in detail, it is clearly understood that the same is by 4. The method of manufacturing a semiconductor wafer according to claim 1, wherein a difference between a thermal expansion coefficient of said base and a thermal expansion coefficient of said semiconductor crystal layer is not more than $4.5 \times 10^{-6} K^{-1}$.

5. The method of manufacturing a semiconductor wafer according to claim 1, wherein said base includes at least one selected from the group consisting of a sintered body and a metal.

6. The method of manufacturing a semiconductor wafer according to claim 1, wherein said semiconductor crystal layer includes at least one selected from the group consisting of a group III-V compound semiconductor crystal, a group II-VI compound semiconductor crystal, and an oxide semiconductor crystal.

7. The method of manufacturing a semiconductor wafer according to claim 1, wherein, in the step of obtaining said composite substrate by attaching said semiconductor crystal layer to the side of said composite base where said base surface flattening layer is located, said base surface flattening layer and said semiconductor crystal layer are attached with a bonding layer interposed between.

8. The method of manufacturing a semiconductor wafer according to claim 7, wherein, in the step of obtaining said composite substrate by attaching said semiconductor crystal layer to the side of said composite base where said base surface flattening layer is located, said base surface flattening layer and said semiconductor crystal layer are attached further with a crystal surface flattening layer, which is formed between said semiconductor crystal layer and said bonding layer to be in contact with said semiconductor crystal layer, interposed therebetween.

9. The method of manufacturing a semiconductor wafer according to claim 8, wherein said crystal surface flattening layer includes at least one selected from the group consisting of silicon oxide, silicon nitride, silicon oxynitride, metal oxide, metal nitride, metal oxynitride, and a metal.

10. A composite substrate, comprising:
a composite base including a base and a base surface flattening layer disposed on said base, wherein said base surface flattening layer has a surface RMS roughness of not more than 1.0 nm, and a thickness of not less than 0.1 µm and not more than 50 µm;
a semiconductor crystal layer disposed on a side of said composite base where said base surface flattening layer is located, and
a bonding layer disposed between said base surface flattening layer and said semiconductor crystal layer,
wherein a difference between a thermal expansion coefficient of said base and a thermal expansion coefficient of said semiconductor crystal layer is not more than $4.5 \times 10^-$ 11. The composite substrate according to claim 10, further comprising a crystal surface flattening layer disposed between said semiconductor crystal layer and said bonding layer to be in contact with said semiconductor crystal layer.

12. The composite substrate according to claim 11, wherein said crystal surface flattening layer includes at least one selected from the group consisting of silicon oxide, silicon nitride, silicon oxynitride, metal oxide, metal nitride, metal oxynitride, and a metal.

* * * * *